(12) United States Patent
Ho et al.

(10) Patent No.: US 6,977,348 B2
(45) Date of Patent: Dec. 20, 2005

(54) HIGH DENSITY LAMINATED SUBSTRATE STRUCTURE AND MANUFACTURE METHOD THEREOF

(75) Inventors: Kwun-Yao Ho, Taipei Hsien (TW); Chen-Yueh Kung, Taipei Hsien (TW)

(73) Assignee: VIA Technologies, Inc., Taipei Hsien (TW)

( * ) Notice: Subject to any disclaimer, the term of this patent is extended or adjusted under 35 U.S.C. 154(b) by 272 days.

(21) Appl. No.: 10/064,424

(22) Filed: Jul. 12, 2002

(65) Prior Publication Data

US 2003/0223207 A1 Dec. 4, 2003

(30) Foreign Application Priority Data

May 28, 2002 (TW) ............................... 91111329 A

(51) Int. Cl.[7] ............................................. H05K 1/11
(52) U.S. Cl. ..................... 174/255; 174/262; 174/264
(58) Field of Search ......................... 174/255, 257, 174/262, 264, 265; 361/792, 795; 29/830, 29/846, 852

(56) References Cited

U.S. PATENT DOCUMENTS

| | | | | |
|---|---|---|---|---|
| 5,046,238 A | * | 9/1991 | Daigle et al. ................. | 29/830 |
| 5,092,032 A | * | 3/1992 | Murakami ..................... | 29/830 |
| 5,121,299 A | * | 6/1992 | Frankeny et al. ............. | 361/785 |
| 5,146,674 A | * | 9/1992 | Frankeny et al. ............. | 29/830 |
| 5,231,751 A | * | 8/1993 | Sachdev et al. .............. | 29/852 |
| 5,287,619 A | * | 2/1994 | Smith et al. .................... | 29/852 |
| 5,374,469 A | * | 12/1994 | Hino et al. .................. | 428/209 |
| 5,401,913 A | * | 3/1995 | Gerber et al. ................ | 174/264 |
| 5,406,459 A | * | 4/1995 | Tsukamoto et al. ......... | 361/768 |
| 5,600,103 A | * | 2/1997 | Odaira et al. ................ | 174/265 |
| 5,768,108 A | * | 6/1998 | Miura et al. ................. | 361/792 |
| 6,163,957 A | * | 12/2000 | Jiang et al. .................... | 29/852 |
| 6,197,407 B1 | * | 3/2001 | Andou et al. ................ | 428/209 |
| 6,262,376 B1 | * | 7/2001 | Hurwitz et al. .............. | 174/255 |
| 6,306,511 B1 | | 10/2001 | Nakao et al. ............... | 428/426 |
| 6,323,439 B1 | * | 11/2001 | Kambe et al. .............. | 174/262 |
| 6,326,561 B1 | * | 12/2001 | Watanabe et al. ........... | 174/264 |
| 6,583,364 B1 | * | 6/2003 | Kurita et al. ................ | 174/254 |
| 6,729,022 B2 | * | 5/2004 | Kurita et al. .................. | 29/846 |
| 6,812,412 B2 | * | 11/2004 | Obata et al. ................. | 174/261 |
| 6,828,669 B2 | * | 12/2004 | Iijima et al. ................. | 257/700 |

FOREIGN PATENT DOCUMENTS

| | | |
|---|---|---|
| CN | 1053785 C | 6/2000 |
| CN | 1286591 A | 3/2001 |
| CN | 1290033 A | 4/2001 |
| JP | 09-051173 | 2/1997 |

* cited by examiner

Primary Examiner—John B. Vigushin
(74) Attorney, Agent, or Firm—Jianq Chyun IP Office

(57) ABSTRACT

A laminated substrate structure composed of a plurality of dielectric layers and a plurality of circuit layers stacked with each other. Each of the dielectric layers has a plurality of via studs, and the circuit layers are electrically coupled with each other through the via studs. The laminated substrate structure of the present invention is characterized by adopting the embedded structure landless design that provides high reliability and better adherence. The present invention also provides a laminated substrate manufacture method. The dielectric layers having the patterned circuit and the dielectric layers having the via holes are formed first, and after the dielectric layers having the patterned circuit and the dielectric layers having the via holes are formed, they are aligned and laminated synchronously to complete the manufacture of the laminated substrate.

7 Claims, 11 Drawing Sheets

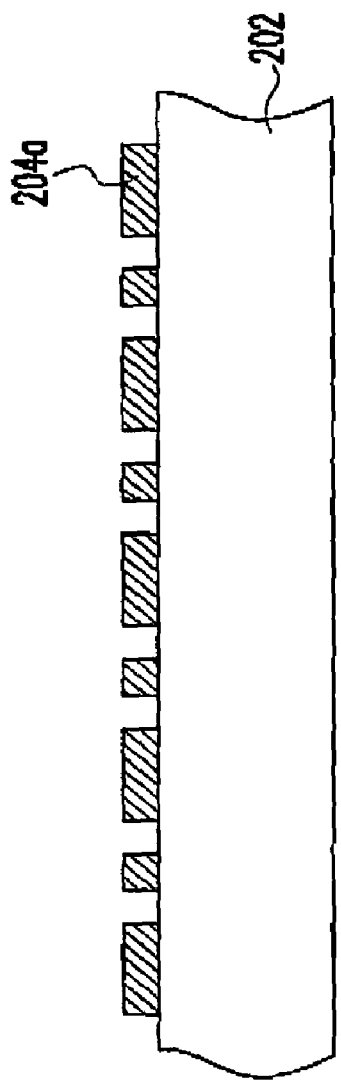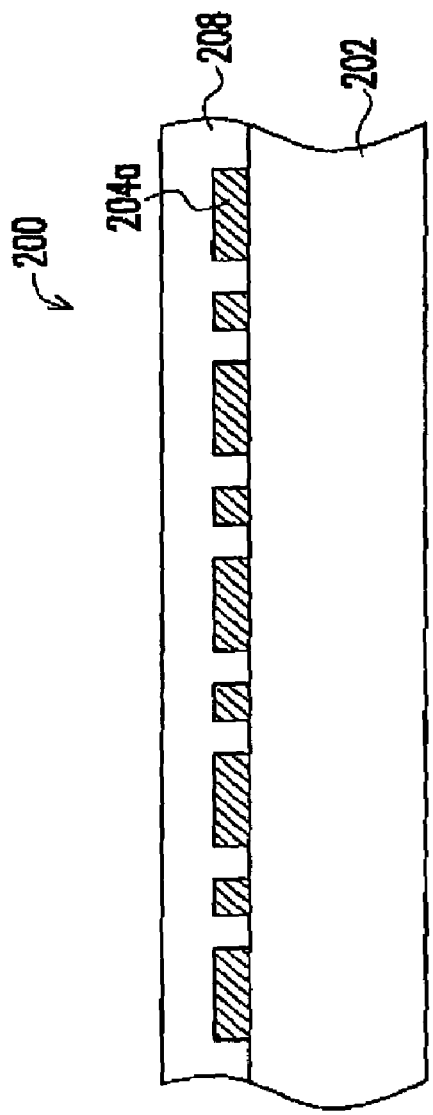
FIG. 2C
FIG. 2D

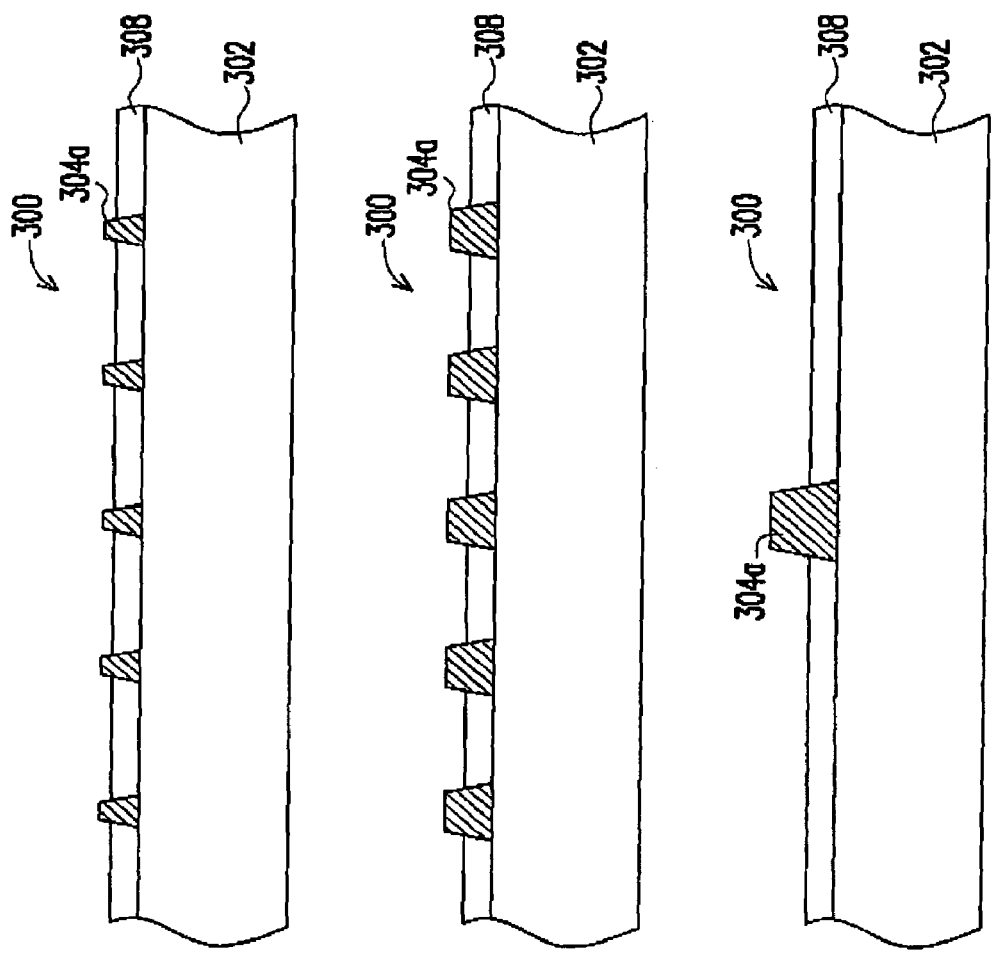

FIG. 4A
FIG. 4B

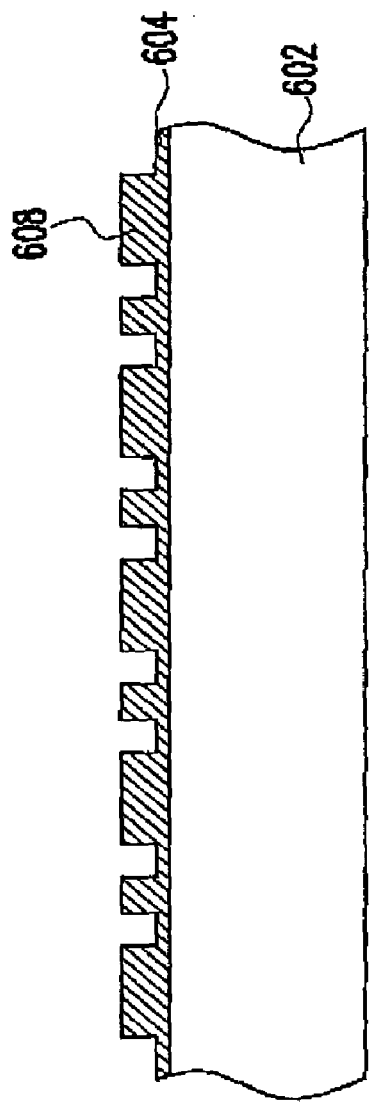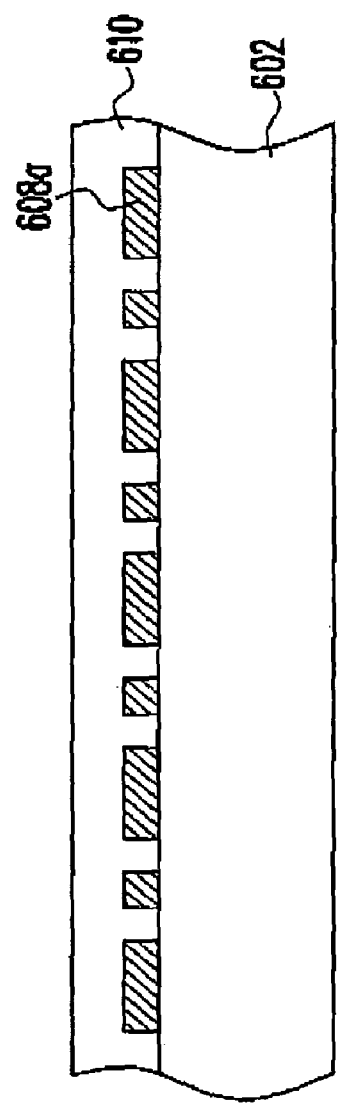
FIG. 6C
FIG. 6D

HIGH DENSITY LAMINATED SUBSTRATE STRUCTURE AND MANUFACTURE METHOD THEREOF

CROSS REFERENCE TO RELATED APPLICATIONS

This application claims the priority benefit of Taiwan application serial no. 91111329, filed May 28, 2002.

BACKGROUND OF INVENTION

1. Field of Invention

The present invention generally relates to a laminated substrate structure and the manufacture method thereof, and more particularly, to a package substrate or Printed Circuit Board (PCB) structure and the manufacture method thereof.

2. Description of Related Art

In line with fast growth and the high demand for electronic technology, the development of electronic products tends towards miniaturization and high density integration. In the packaging field, the development of the Ball Grid Array (BGA) and Chip Scale Package (CSP) is targeted at the market requirements for miniaturization and high-density integration. For the Printed Circuit Board (PCB), in order to minimize the circuit area used, the technology of the multi-layered structure is applied. However, the substrate used in BGA, CSP and the manufacture of PCB all uses vias that are made of conductive material to connect between layer circuits. Therefore, the fine trace circuit on the laminated substrate and the small dimension vias can improve the package density and the PCB integration.

The conventional laminated substrate manufacture method is mainly divided into two categories: lamination process and build up process. The lamination process provides a plurality of isolation layers first, then forms a circuit layer on the surface of the isolation layers, and performs the drill, plate, and hole plugging process on each isolation layer to form a plating through hole (PTH), so that the circuit layer on the surface of the isolation layer is electrically coupled by the plating through hole formed by the via process. After the via is formed in each isolation layer, the conductive circuit is subsequently formed on the laminated surface copper layer. Afterwards, the substrate or the circuit board is made by repeatedly performing a process that comprises aligning a determined number of the isolation layers to the surface copper layer, laminating them into a laminated substrate, and forming a conductive circuit.

When the laminated substrate is made by using the conventional lamination process, the via forming, plating through hole and the isolation material hole plugging operations must be performed on the isolation layer, and the process is rather sophisticated and time consuming. Moreover, the process difficulty and unit cost significantly increase accordingly when the isolation layer via dimension approaches 100 micrometers or below. When the via dimension is less than 100 micrometers or below, there is as yet no mass production product provided by vendors. Therefore, there is a mass production technology bottleneck problem when the plating through hole is less than 100 micrometers.

Besides the lamination process, the build up process is also broadly adopted by vendors. The build up process mainly forms the dielectric layer, the inter-layer via in the dielectric layer, and the circuit layer on the surface of the dielectric layer sequentially from bottom to over both sides of the laminated core substrate. The dielectric layer in the laminated substrate is mainly formed by using the lamination or coating method. After the dielectric layer is formed, an opening is formed in the dielectric layer by using the image forming/etching process or the laser/plasma etch method, and the inter-layer via is formed by filling the conductive material into the opening or by using the plating method. After the inter-layer via is formed, a sophisticated chemical surface process is performed and the circuit layer is formed on the surface of the dielectric layer. The laminated substrate is formed by repeatedly performing the sophisticated and difficult manufacture steps of the dielectric layer, inter-layer via, chemical surface process, and forming the circuit layer.

In the substrate formed by the build up process, each dielectric layer and circuit layer has to be formed sequentially, so that the whole process is too lengthy. Moreover, the quality of forming each dielectric layer and circuit layer directly impacts the yield of the whole building substrate, thus it is not easy to control the process yield. When the substrate is formed by the build up process, besides the problem of the lengthy process and the low process yield, it also has the problems of high process cost and big equipment investment cost, or the reliability deteriorates due to the process not being easy to control.

FIG. 1 schematically shows a sketch view of the contact position of the circuit layer and the via in the conventional laminated substrate structure, wherein the contact position has a via land. Referring to FIG. 1, a circuit 100a and a via land 102a are isolated from a circuit 100b and a via land 102b by a dielectric layer (not shown). The dimensions of the via land 102a, 102b are usually designed to be wider than the linewidth of the circuit 100a, 100b, so as to assure that two circuit layers are electrically coupled by the via 104 in the dielectric layer. However, the via land 102a and the via land 102b usually reduce the layout space of the circuit layer, so that the circuit density in the laminated substrate cannot be efficiently improved.

SUMMARY OF INVENTION

Therefore, the object of the present invention is to provide a laminated substrate structure, in which a landless design is applied onto the contact position of its circuit layer and its via to improve the circuit density in the laminated substrate.

Another object of the present invention is to provide a laminated substrate structure, wherein the structure has good electrical performance and good thermal performance.

Another object of the present invention is to provide a laminated substrate manufacture method, wherein the manufacture method is characterized by high process yield, high production capacity, ease of manufacture, high density and low manufacture cost.

In order to achieve the objects of the present invention mentioned above, a laminated substrate structure is provided. The laminated substrate structure is composed of a plurality of dielectric layers and a plurality of circuit layers stacked with each other. A plurality of vias exists in the dielectric layer, and the circuit layers are electrically coupled to each other through the vias in the dielectric layer. The laminated substrate structure of the present invention is characterized by the circuit layer pattern between the dielectric layers being a landless design. The landless design circuit layer pattern can efficiently improve the circuit integration in the laminated substrate.

The laminated substrate structure of the present invention further comprises at least a via opening layer arranged on the two most exterior dielectric layers. The via opening layer has a plurality of openings corresponding to two vias in the most exterior of the dielectric layers. Moreover, this most exterior dielectric layer or a solder mask layer may be applied or may not be applied to the via opening layer depending on the requirement.

In order to achieve the objectives of the present invention mentioned above, a laminated substrate manufacture method is provided. There are two groups divided as forming of the dielectric layer having a patterned circuit and the dielectric layer having a via are performed first. After the forming of the dielectric layer having the patterned circuit and the dielectric layer having the via finishes, the alignment is performed onto them, and finally laminates them to form the laminated substrate. The dielectric layer having the patterned circuit and the dielectric layer having the via are laminated by using the method such as the vacuum thermal lamination. Moreover, after the alignment and lamination of the dielectric layer having the patterned circuit and the dielectric layer having the via, a curing step is performed to cure the dielectric material in the dielectric layer having the patterned circuit and the dielectric layer having the via.

In order to achieve the objectives of the present invention mentioned above, a laminated substrate manufacture method is provided. The forming of the dielectric layer having a patterned circuit, the dielectric layer having a via, and the via opening layer optionally applied are performed first. After the forming of the dielectric layer having the patterned circuit, the dielectric layer having the via, and the via opening layer, the alignment is performed onto them, finally laminating them to form the laminated substrate. The dielectric layer having the patterned circuit and the dielectric layer having the via are laminated by using a method such as the vacuum thermal lamination. Moreover, after the alignment and lamination of the dielectric layer having the patterned circuit and the dielectric layer having the via, a curing step is performed to cure the dielectric material in the dielectric layer having the patterned circuit and the dielectric layer having the via, and form the electrical connection at appropriate via circuit position.

The present invention provides a first supporter first, a patterned circuit is subsequently formed on the first supporter, and a first dielectric layer is formed on the first supporter finally to cover the patterned circuit. Therefore, a dielectric layer having the patterned circuit can be formed on the first supporter.

The present invention provides a second supporter first, a plurality of via studs subsequently formed on the second supporter, and finally a second dielectric layer is formed on the second supporter, wherein the via studs extrude from the surface of the second dielectric layer. Therefore, a dielectric layer having via studs can be formed on the second supporter.

The patterned circuit of the present invention is formed by using the method such as the metal etching, pattern plating, semi-additive, or full-additive. Moreover, the first dielectric layer and the second dielectric layer are formed by using film, or by the coating, spray coating, or agglutinate method.

The opening in the via opening layer of the present invention is formed by using the mechanical drilling, laser drilling, or hole punch method.

BRIEF DESCRIPTION OF DRAWINGS

The accompanying drawings are included to provide a further understanding of the invention, and are incorporated in and constitute a part of this specification. The drawings illustrate embodiments of the invention, and together with the description, serve to explain the principles of the invention. In the drawings, FIG. 1 schematically shows a sketch map of the contact position of the circuit layer and the via in the conventional laminated substrate structure, wherein the contact position has a via land;

FIGS. 2A–2D schematically shows a sectional sketch map of the manufacture process of a dielectric layer that has a patterned circuit in the laminated substrate of the first embodiment according to the present invention;

FIGS. 3A–3D schematically shows a sectional sketch map of the manufacture process of a dielectric layer that has a via in the laminated substrate of the first embodiment according to the present invention;

FIG. 4A and FIG. 4B schematically show the sectional sketch maps of the manufacture process of the via opening layer in the laminated substrate of the first embodiment according to the present invention;

FIGS. 6A–6D schematically shows a sectional sketch map of the manufacture process of a dielectric layer that has a patterned circuit in the laminated substrate of the second embodiment according to the present invention.

DETAILED DESCRIPTION

The First Embodiment

Figure 2A:
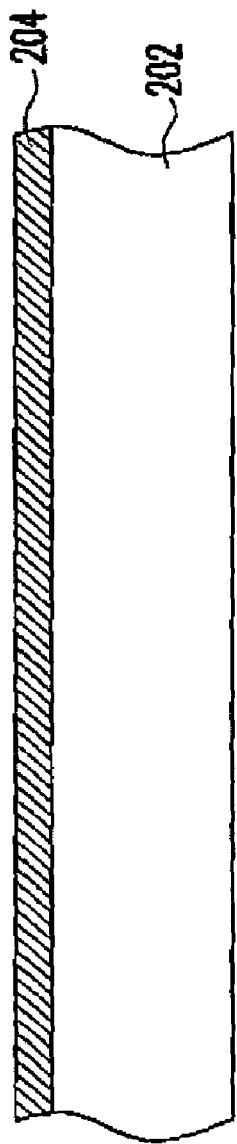

FIGS. 2A–2D schematically show a sectional sketch views of the manufacture process of the circuit parts that have a patterned circuit in the laminated substrate of the first embodiment according to the present invention. The patterned circuit in the laminated substrate of the present invention is formed by using a method such as metal etching, pattern plating, semi-additive, or full-additive. Metal etching is used in the present embodiment for description. Referring to FIG. 2A first, a supporter 202 is provided, and a conductive layer 204 is subsequently formed on the supporter 202. The conductive layer 204 is made of material such as copper, and the conductive layer 204 is formed on the supporter 202 by using a method such as sputtering, lamination adherence or deposition.

Figure 2B:
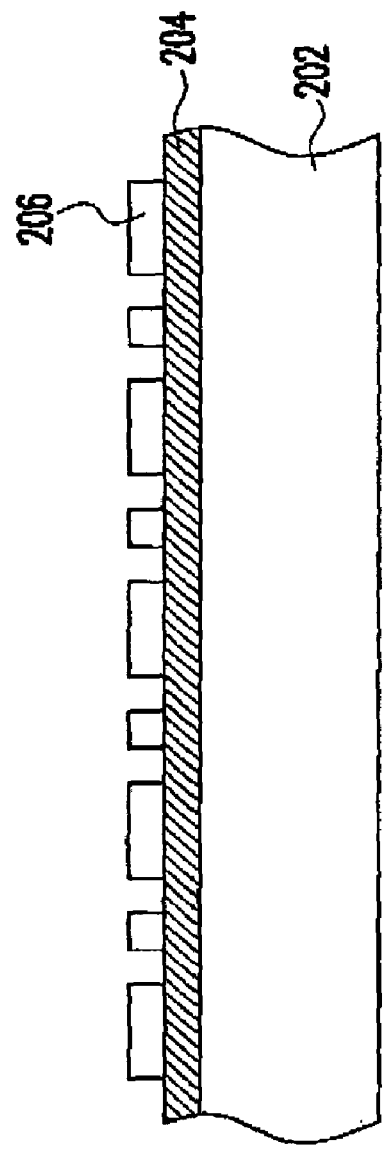

Referring to both FIG. 2B and FIG. 2C simultaneously, a patterned photoresist 206 is subsequently formed on the conductive layer 204, the patterned photoresist 206 is used to define the pattern of the conductive layer 204 below it. The patterned photoresist 206 is formed on the conductive layer 204 through the steps of the photoresist coating, exposure, and developing. After the patterned photoresist 206 is formed, the patterned photoresist 206 is used as a mask to etch the conductive layer 204 below it, so that a portion of the conductive layer 204 that is not covered by the patterned photoresist 206 is removed to form the patterned circuit 204a. Afterwards, the patterned photoresist 206 is stripped from the conductive layer 204 surface.

Then, referring to FIG. 2D, after the patterned circuit 204a is formed, a dielectric layer 208 is subsequently formed on the supporter 202 covering the patterned circuit 204a. The patterned circuit 204a and the dielectric layer 208 constitute a part 200 having embedded patterned circuits.

Figure 3A:
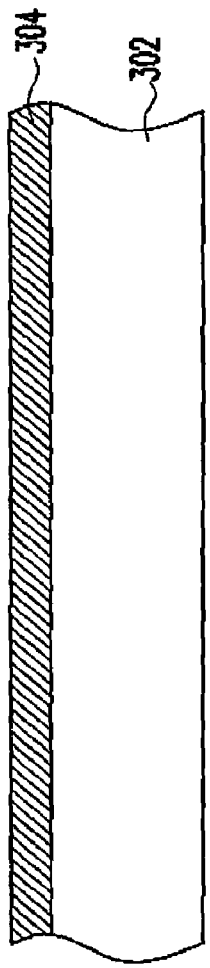

FIGS. 3A–3D schematically shows a sectional sketch map of the manufacture process of parts containing via and via pad in the laminated substrate of the first embodiment according to the present invention. Referring to FIG. 3A first, a supporter 302 is provided, and a conductive layer 304 is subsequently formed over the supporter 302, which is peelable from the conductive metal and the dielectric regions. Wherein, the conductive layer 304 is made of a material such as copper, and the conductive layer 304 is formed over the supporter 302 by using a method such as sputtering, lamination adherence or deposition.

Figure 3B:
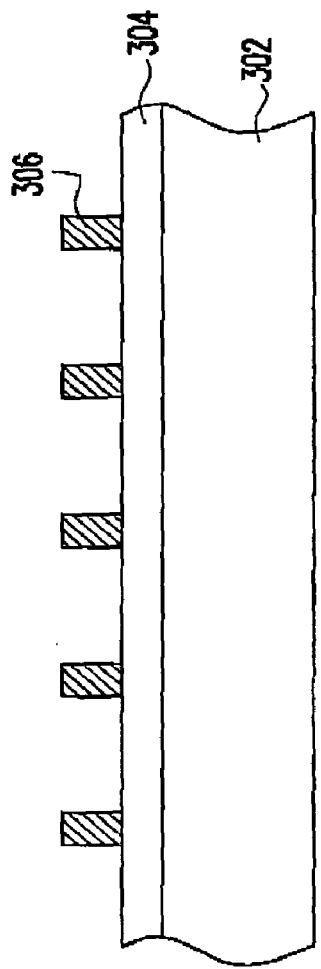
Figure 3C:
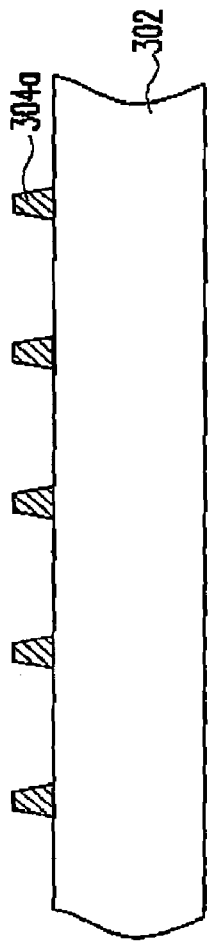

Referring to both FIG. 3B and FIG. 3C simultaneously, a patterned photoresist 306 is subsequently formed on the conductive layer 304, the patterned photoresist 306 is used to define the pattern of the conductive layer 304 below it. The patterned photoresist 306 is formed on the conductive layer 304 through the steps of the photoresist coating, exposure, and developing. After the patterned photoresist 306 is formed, the patterned photoresist 306 is used as a mask to etch the conductive layer 304 below it, so that a portion of the conductive layer 304 that is not covered by the patterned photoresist 306 is removed to form the via studs 304a. Afterwards, the patterned photoresistor 306 is stripped from the conductive layer 304.

Referring to FIG. 3D, after the via stud 304a is formed, a dielectric layer 308 is subsequently formed on the supporter 302 to cover the via studs 304a. The via studs 304a and the dielectric layer 308 constitute a part 300 having via studs. FIG. 3D shows that the dimension of the via studs 304a can vary depending on the process requirement.

FIG. 4A and FIG. 4B schematically show the sectional sketch views of the manufacture process of the via opening layer in the laminated substrate of the first embodiment according to the present invention. Referring to both FIG. 4A and FIG. 4B simultaneously, a supporting layer 400 is provided first, and an opening 402 is formed in the supporting layer 400 to form a via opening layer 400a. The opening 402 in the via opening layer 400a could be formed by using mechanical drilling, laser drilling, or hole punch method.

Figure 5A:
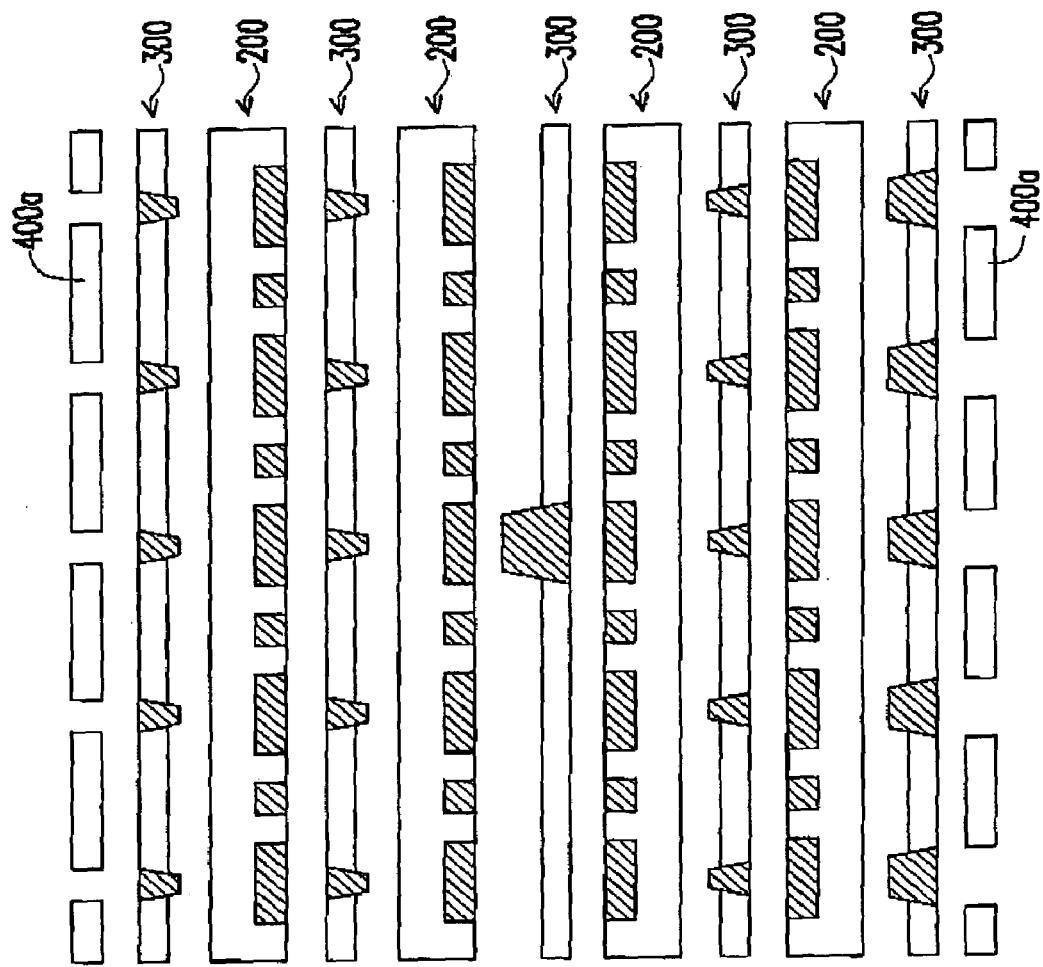
FIG. 5A and FIG. 5B schematically show the sectional sketch maps of the lamination process performed onto the laminated substrate of the first embodiment according to the present invention.
Figure 5B:
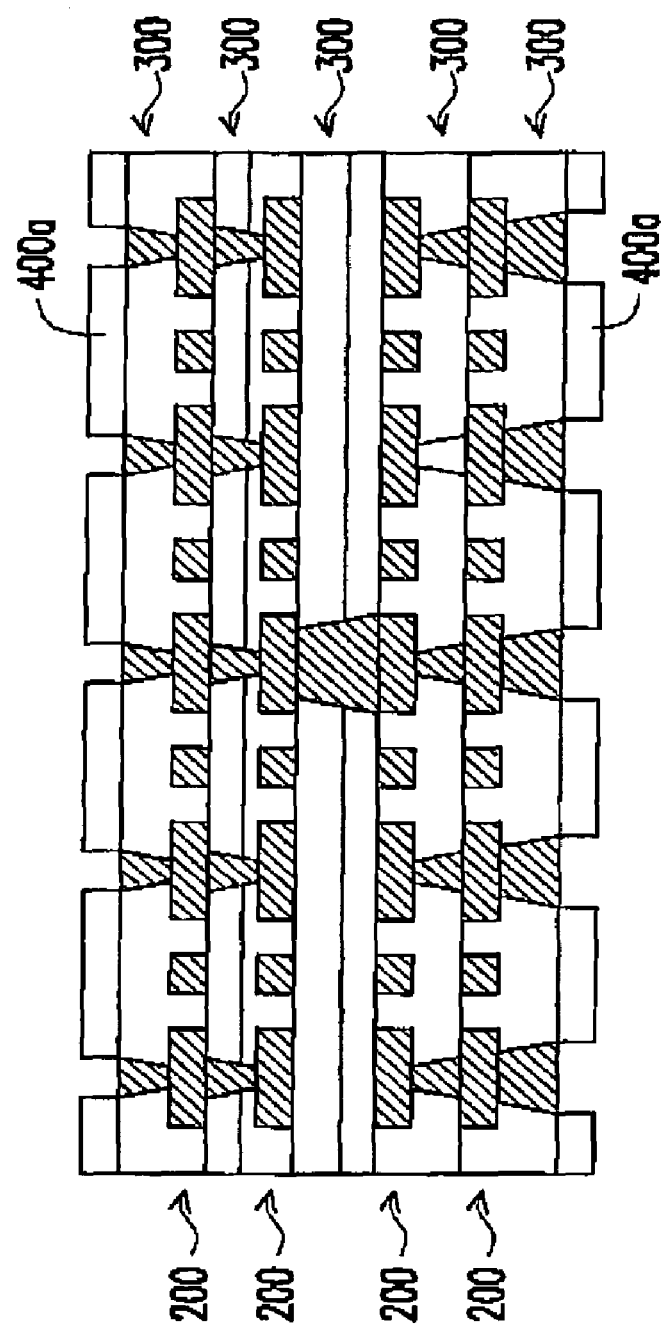

FIG. 5A and FIG. 5B schematically show the sectional sketch views of the lamination process performed onto the laminated substrate of the first embodiment according to the present invention. Referring to both FIG. 5A and FIG. 5B simultaneously, first aligning a plurality of dielectric layers 200 having patterned circuits with a plurality of dielectric layers 300 having via studs and a plurality of via opening layer 400a as shown in FIG. 5A. After the alignment, the dielectric layers 200 having patterned circuits, dielectric layers 300 having via studs, and the via opening layer 400a are laminated together to complete the forming of the laminated substrate. The dielectric layers 200 having patterned circuits, the dielectric layer 300 having via studs, and the via opening layers 400a are laminated by using the vacuum thermal lamination method.

Referring to FIG. 5A and FIG. 5B, in the manufacture process of the laminated substrate, the via opening layer 400a is an optional component. In other words, the present invention may align and laminate the plurality of parts 200 having patterned circuits with a plurality of parts 300 having via studs only. Therefore, the via opening layer 400a can be saved in the manufacture process of the laminated substrate, so that the whole process can be further simplified.

The Second Embodiment

The present embodiment is the same as the first embodiment in forming the dielectric layer having the via studs and the via opening layer. The difference between the present embodiment and the first embodiment is in the manufacture method of the dielectric layer having the patterned circuit.

Figure 6A:
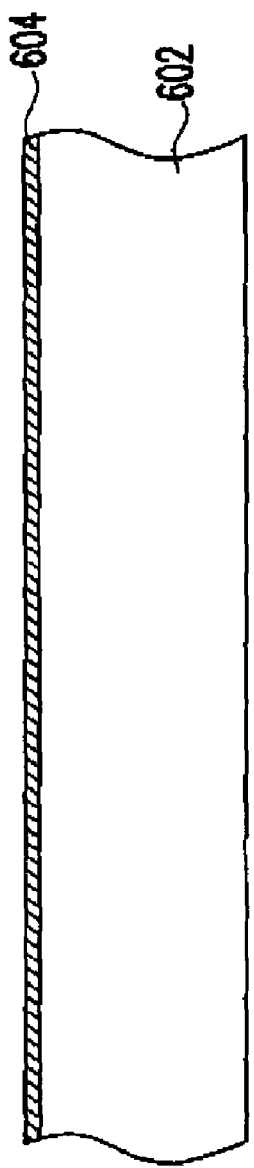

FIGS. 6A–6D schematically shows sectional sketch views of the manufacture process of the dielectric layer that has a patterned circuit in the laminated substrate of the second embodiment according to the present invention. Referring to FIG. 6A first, a supporter 602 is provided, and a conductive layer 604 is subsequently formed on the supporter 602. The conductive layer 604 is made of material such as copper, and the conductive layer 604 is formed on the supporter 602 by using a method such as sputtering, lamination adherence or deposition.

Figure 6B:
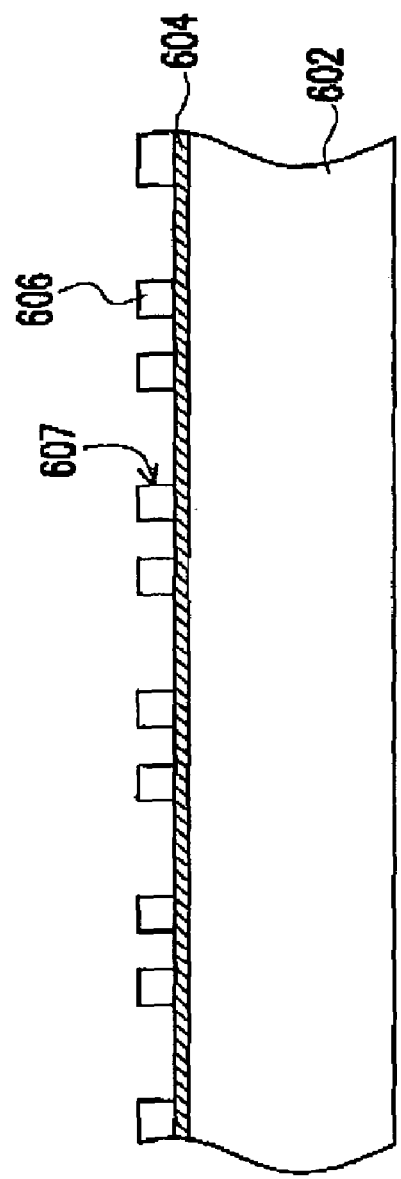

Then, referring to both FIG. 6B and FIG. 6C simultaneously, a patterned photoresist 606 is subsequently formed on the conductive layer 604, and the patterned photoresist 606 has a plurality of openings 607. The patterned photoresist 606 is formed on the conductive layer 604 through the steps of the photoresist coating, exposure, and developing. After the patterned photoresist 606 is formed, the conductive layer 608 is filled into the opening 607 of the patterned photoresist 606. Since the opening 607 has a specific pattern, the conductive layer 608 filled into the opening 607 is consistent with the specific pattern mentioned above. Afterwards, the patterned photoresist 606 is stripped from the conductive layer 604 to expose the conductive layer 604 below it.

Referring to FIG. 6C and FIG. 6D, after the patterned photoresistor 606 is stripped from the conductive layer 604, a non-optional step of micro etching is subsequently performed to remove the conductive layer 604. In the process of removing the conductive layer 604, a portion of the conductive layer 608 thickness is etched to form a patterned circuit 608a. After the patterned circuit 608a is formed, a dielectric layer 610 is subsequently formed on the supporter 602 covering the patterned circuit 608a. The patterned circuit 608a and the dielectric layer 610 constitute parts 600 having a patterned circuit.

In the manufacture process of FIG. 6A to FIG. 6D mentioned above, a thin trace circuit can be formed in the laminated substrate. The fine trace circuit manufacture process (FIG. 6A to FIG. 6D) efficiently improves the circuit density in the laminated substrate, and is also helpful to the layout flexibility of the circuit layer in the laminated substrate.

Figure 7:
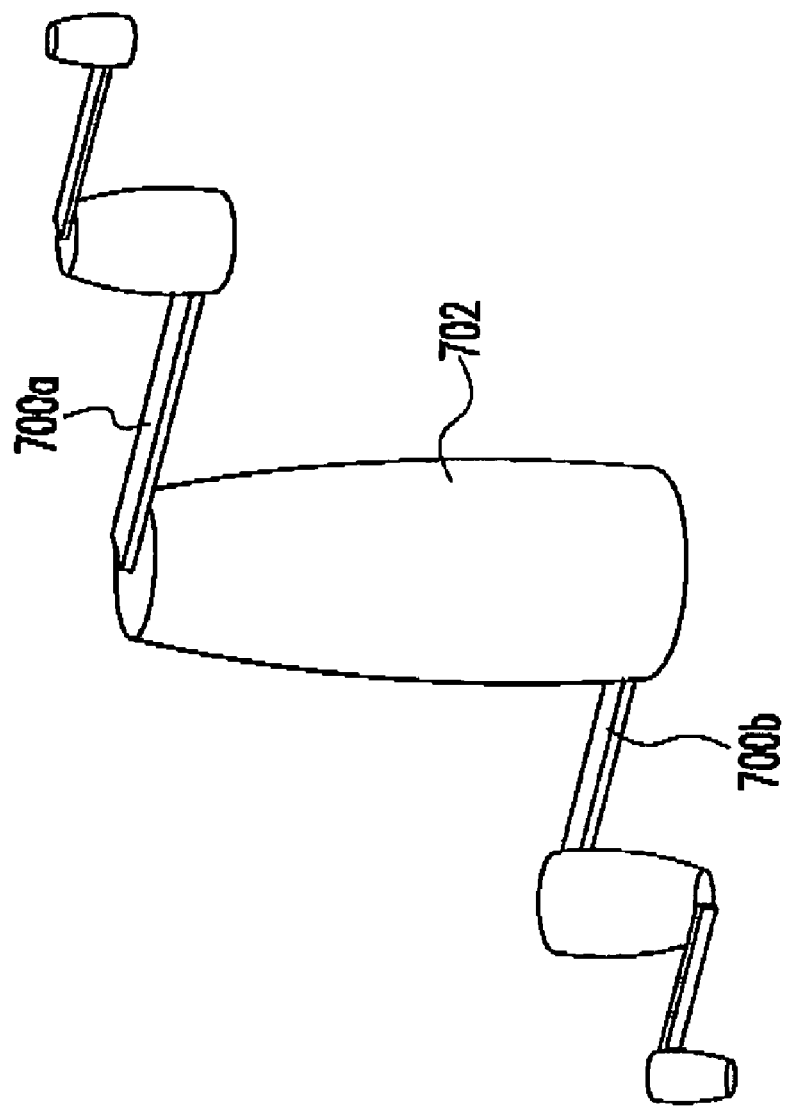
FIG. 7 schematically shows a sketch map of the contact position of the circuit layer and the via in the laminated substrate structure of the first embodiment and the second embodiment according to the present invention, wherein the contact position has a landless design.

FIG. 7 schematically shows a sketch view of the contact position of the circuit layer and the via in the laminated substrate structure of the first embodiment and the second embodiment according to the present invention, wherein the contact position has a landless design. Referring to FIG. 7, the circuit 700a is isolated from the circuit 700b by a dielectric layer (not shown), and the circuit 700a is electrically coupled to the circuit 700b by a via hole 702.

Figure 1:
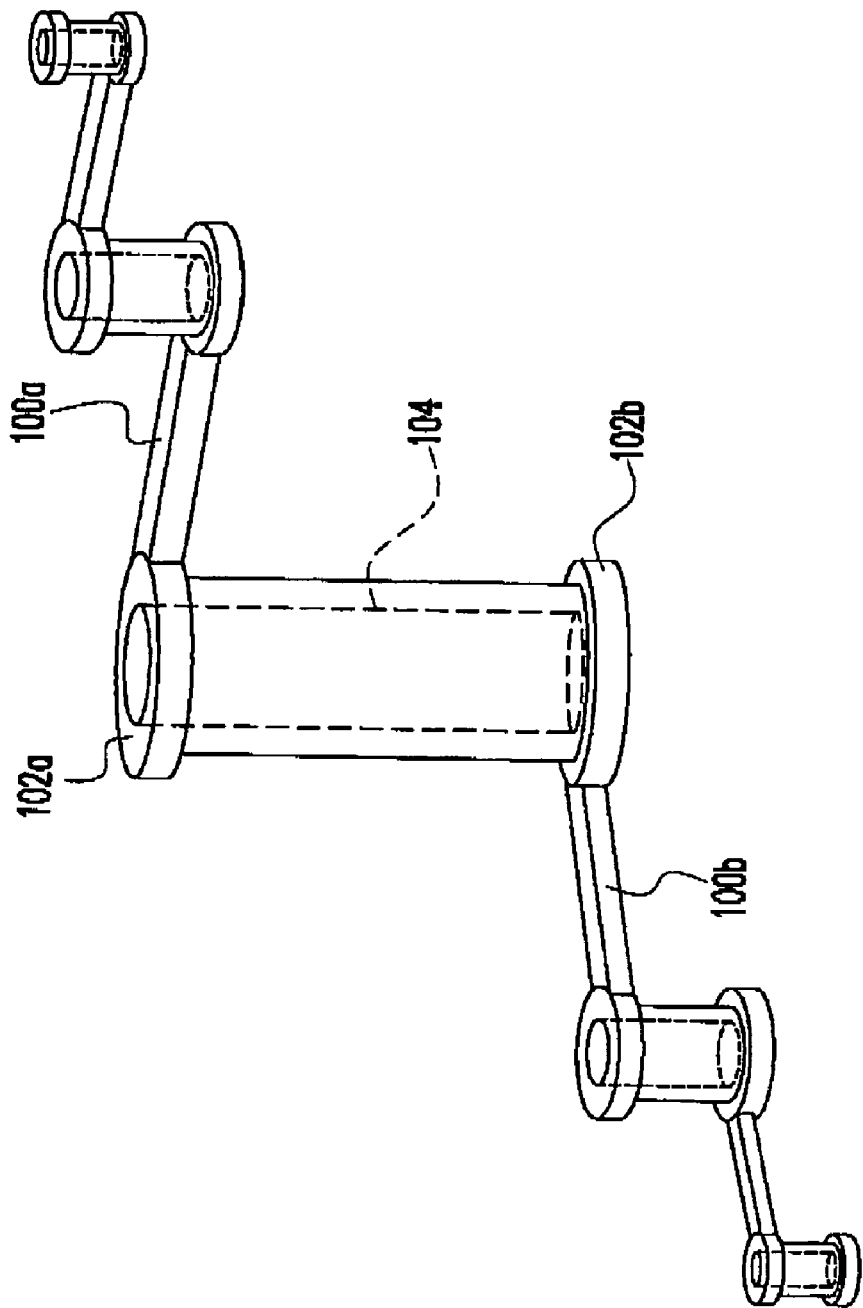

Referring to both FIG. 1 and FIG. 7 simultaneously, in the present embodiment, the circuit 700a and circuit 700b are electrically coupled to the via stud 702 directly without the help of the conventional via land 102a and 102b (as shown in FIG. 1). Therefore, the layout space of the circuit layer in the present embodiment is not reduced by the limitation of the via land 102a and 102b.

In summary, the laminated substrate structure of the present invention and the manufacture method thereof at least has the following advantages:

1. In the laminated substrate structure of the present invention, the contact position of the circuit layer and the via adopts a landless design, so that the circuit integration in the laminated substrate is significantly improved.

2. In the laminated substrate structure of the present invention, the via stud adopts a solid via design to give it good electrical performance and good thermal performance.

3. In the laminated substrate structure of the present invention, the laminated substrate is formed by using the methods of pattern process and simultaneous lamination, so that the manufacture time can be efficiently reduced, and the productivity is further improved.

4. In the laminated substrate structure of the present invention, the laminated substrate is formed by using the method of pattern process and synchronous lamination, so that the conventional investment in other equipment can be saved.

5. In the laminated substrate structure of the present invention, before each layer (the dielectric layer having the patterned circuit, the dielectric layer having the via stud, and the via opening layer) is laminated, the confirmation of acceptable quality can be made onto each layer respectively, so that the yield of the laminated substrate can be easily controlled and the manufacture cost can be efficiently reduced.

Although the invention has been described with reference to a particular embodiment thereof, it will be apparent to one of the ordinary skill in the art that modifications to the described embodiment may be made without departing from the spirit of the invention. Accordingly, the scope of the invention will be defined by the attached claims not by the above detailed description.

What is claimed is:

1. A laminated substrate structure, comprising:
   a plurality of first dielectric layers, each of the first dielectric layers has a plurality of via studs;
   a plurality of second dielectric layers, each of the second dielectric layers has a circuit layer, wherein the second dielectric layers are laminated to the first dielectric layers and the circuit layers are electrically coupled to each other through the via studs, wherein the via studs in two most exterior dielectric layers are used as a plurality of solder pads directly; and
   at least a via opening layer, respectively arranged on the two most exterior dielectric layers.

2. The laminated substrate structure of claim 1, wherein a pattern of the circuit layers is designed as landless.

3. The laminated substrate structure of claim 1, wherein the via opening layer is a dielectric layer, and the dielectric layer has a plurality of openings.

4. The laminated substrate structure of claim 1, wherein the via opening layer is a solder mask layer, and the solder mask layer has a plurality of openings.

5. A laminated substrate structure comprising:
   a plurality of embedded patterned circuits, each embedded patterned circuit, comprising a patterned circuit embedded in a corresponding one of a plurality of first dielectric layers;
   a plurality of via stud layers, each via stud layer comprising a plurality of via studs encompassed by a second dielectric layer, wherein tops of the via studs are protruded from one surface of the second dielectric layer; and
   a plurality of via opening layers, each via opening layer comprising a third dielectric layer having a plurality of openings therein, wherein the embedded patterned circuits and the via stud layers and the via opening layers are laminated together having at least some of the via studs aligned and contacted directly with some of the embedded patterned circuits, and the via openings of the two via opening layers at least aligned with some of the via studs of the via stud layers adjacent to the two via opening layers.

6. The laminated substrate structure of claim 5, further comprising two via opening layers, arranged as two most exterior dielectric layers of the laminated substrate structure.

7. The laminated substrate structure of claim 6, wherein the via opening layer is a solder mask layer, and the solder mask layer has a plurality of openings.

* * * * *